United States Patent [19]
Hong et al.

[11] Patent Number: 5,472,898
[45] Date of Patent: Dec. 5, 1995

[54] PROCESS FOR MAKING A MASK ROM WITH SELF-ALIGNED CODING TECHNOLOGY

[75] Inventors: Gary Hong; Chen-Chiu Hsue, both of Hsinchu, Taiwan

[73] Assignee: United Microelectronics Corp., Hsinchu, Taiwan

[21] Appl. No.: 287,949

[22] Filed: Aug. 9, 1994

[51] Int. Cl.[6] .................................................. H01L 21/265
[52] U.S. Cl. .................................. 437/48; 437/45; 437/52
[58] Field of Search .................................. 437/45, 48, 52; 257/390–391

[56] References Cited

U.S. PATENT DOCUMENTS

| | | | |
|---|---|---|---|
| 5,306,657 | 4/1994 | Yang | 437/52 |
| 5,318,921 | 6/1994 | Hsue et al. | 437/52 |
| 5,418,175 | 5/1995 | Hse et al. | 437/48 |

OTHER PUBLICATIONS

Homma, et al., A Selective $SiO_2$ film-formation Technology Using Liquid–Phase Deposition for fully Planarized Multi-level Interconnections, J. Electrochem. Soc., vol. 140, No. 8, Aug. 1993.

*Primary Examiner*—Olik Chaudhuri
*Assistant Examiner*—H. Jey Tsai
*Attorney, Agent, or Firm*—Ladas & Parry

[57] ABSTRACT

A self-aligned coding process for mask ROM is disclosed. First, a substrate having a plurality of bit-lines formed therein, a gate oxide layer formed on the bit-lines, and a plurality of word-lines formed on the gate oxide, which together construct an array of memory cells, is provided. Next, a barrier layer is formed on the word-lines. A silicon dioxide layer is formed on the gate oxide between the word-lines by using liquid phase deposition, wherein the thickness of the silicon dioxide layer is larger than that of the word-lines. Then, the barrier layer is removed. A mask layer is formed on the substrate exposing parts of the memory cells that will be programmed. Finally, impurities are implanted into the substrate not covered by the mask layer and the silicon dioxide layer to make the memory cells that will be programmed operating in a first state, and leave other non-programmed memory cells operating in a second state.

14 Claims, 6 Drawing Sheets

PROCESS FOR MAKING A MASK ROM WITH SELF-ALIGNED CODING TECHNOLOGY

BACKGROUND OF THE INVENTION

1. Field of the Invention

The present invention relates generally to a mask ROM having self-aligned programming by implantation, and more particularly, to a method making same using liquid phase deposition (LPD) to form a self-aligned mask for ROM coding.

2. Description of the Prior Art

FIG. 1 shows a plan view of a prior art mask ROM. FIG. 2 shows a cross-sectional view of the prior art mask ROM taken on line II—II of FIG. 1. FIG. 3 shows a cross-sectional view of the prior art mask ROM taken on line III—III of FIG. 1. As is best illustrated in FIG. 2, the prior art mask ROM comprises: a P-type semiconductor substrate 10; a plurality of $N^+$ type bit-lines 12 formed on the P-type semiconductor substrate 10 by the implantation of impurities thereinto; a gate oxide layer 14 formed on the surface of the P-type semiconductor substrate 10 and the bit-lines 12; and a plurality of word-lines 16 formed on the gate oxide layer 14, which together form an array of memory cells.

The prior art technique for programming a memory cell of mask ROM 1 involves implanting an impurity 18 which prevents conduction between the two adjacent bit lines 12. This programming technique first involves forming a photoresist layer 20 over the substrate 10. Next, conventional photolithography and etching techniques are used to form an opening 22. Thereafter, boron ions are implanted into the substrate 10 through the opening 22 to form a P type region 18 which is doped so heavily that conduction is cut off even when an electrical potential is applied to the overlying word-line 16.

However, the foregoing prior art method has a drawback in that it is difficult to locate the opening 22 precisely on the photoresist 20. If the opening is improperly positioned on the photoresist 20, that causes a side-diffusion effect which is problematic because it can affect the conduction state of adjacent memory cells. For example, a supposedly conducting memory cell can become non-conducting and vice versa due to this side-diffusion effect.

SUMMARY OF THE INVENTION

A principal object of the present invention is to provide an effective and easily implemented method for coding the memory cells of a mask ROM.

Another object of the present invention is to provide a self-aligned coding process for a mask ROM that resolves the aforementioned problem of ROM coding misalignment and the side-diffusion of doped impurities caused thereby.

In accordance with the objects of the present invention, a method of self-aligned coding for a mask ROM is disclosed. First, a substrate having a plurality of bit-lines formed therein, a gate oxide layer formed on the bit-lines, and a plurality of word-lines formed on the gate oxide, which together construct an array of memory cells, is provided. Next, a barrier layer is formed on the word-lines. A silicon dioxide layer is formed on the gate oxide between the word-lines by using liquid phase deposition, wherein the thickness of the silicon dioxide layer is larger than that of the word-lines. Then, the barrier layer is removed. A mask layer is formed on the substrate exposing parts of the memory cells that will be programmed. Finally, impurities are implanted into the substrate not covered by the mask layer and the silicon dioxide layer to make the memory cells that will be programmed operating in a first state, and leave other non-programmed memory cells operating in a second state.

Sidewall spacers can also be formed on the side walls of the silicon dioxide layer to guide the impurity implantation more precisely.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENTS

Figure 1:
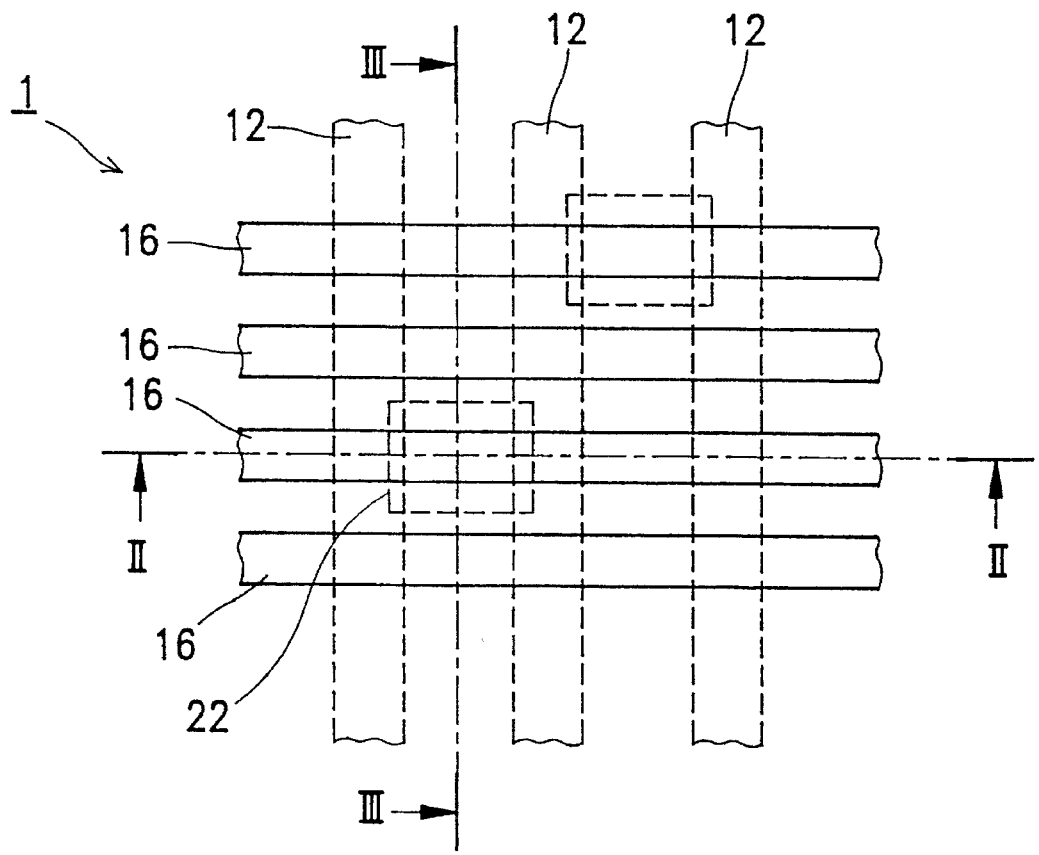
FIG. 1 is a plan view of a prior art mask ROM.
Figure 2:
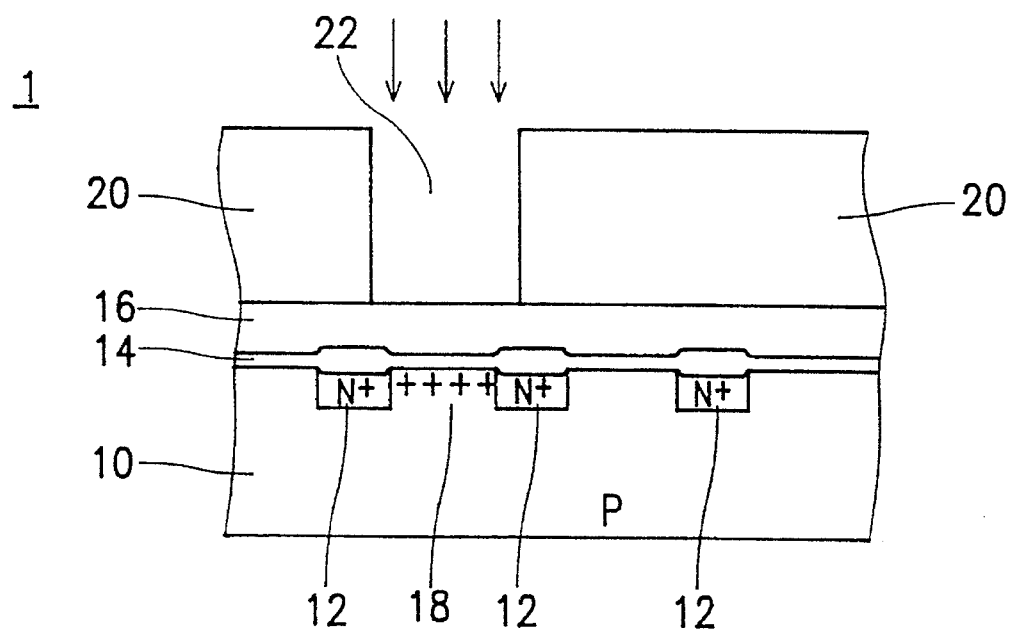
FIG. 2 is a cross-sectional view of the prior art mask ROM taken on line II—II of FIG. 1.
Figure 3:
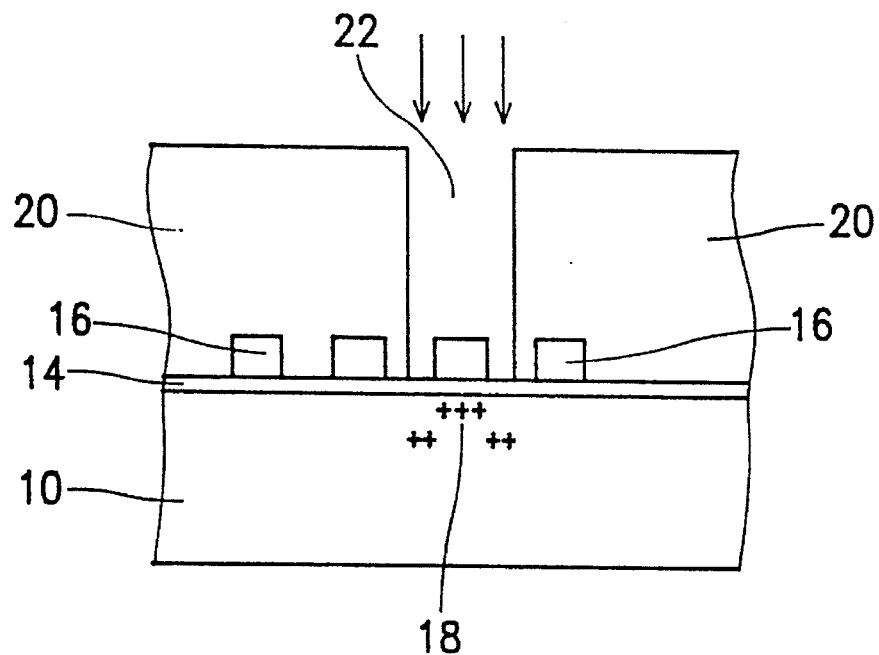
FIG. 3 is a cross-sectional view of the prior art mask ROM taken on line III—III of FIG. 1.
Figure 6A:
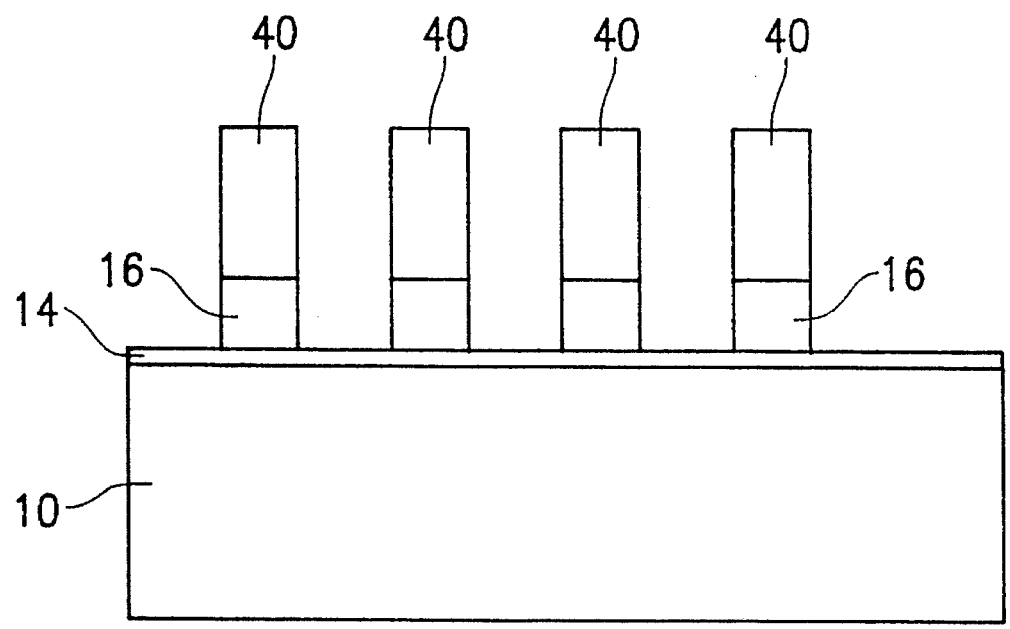
FIGS. 6(a) to 6(e) are cross-sectional views taken on line VI—VI of FIG. 5 illustrating the process steps of preferred embodiments according to the present invention.

Referring to FIG. 5 and FIGS. 6(a) to 6(d), a self-aligned implantation method according to the present invention is described, which is suitable for coding a mask ROM. The disclosure hereinafter provided designates parts or elements of the mask ROM manufactured according to the method of the present invention with reference numerals similar to those of the prior art mask ROM of FIG. 1 and FIG. 3 for the sake of clarity. The mask ROM 1 fabricated in accordance with the method of the present invention includes: a substrate 10 (N-type or P-type), a plurality of bit-lines 12 (not shown in FIGS. 6(a) to 6(d), but they are configured as is shown in FIGS. 1 and 3) formed in the substrate 10, a gate oxide 14 formed on the substrate 10, and a plurality of word-lines 16 formed on the gate oxide 14, which together define the memory cells. The self-aligned mask ROM coding method of the present invention includes the following steps:

Step 1:

Referring to FIG. 6(a), a barrier layer 40 is formed on the word-lines 16. For example, a gate oxide 14 with a thickness of about 100–150 A (Angstrom) is formed on a silicon substrate 10 having bit-lines 12 (not shown) formed therein. Next, a polysilicon layer 16 (or a polycide layer such as $WSi_2$) with a thickness of about 3000 A is deposited over the gate oxide 14 by chemical vapor deposition (CVD). A barrier layer, such as a photoresist 40, is coated on the polysilicon layer 16 and patterned by a conventional photolithography process. Then, the polysilicon layer 16 is etched to form the word-lines 16 using the patterned photoresist layer 40 as a mask.

Figure 4:
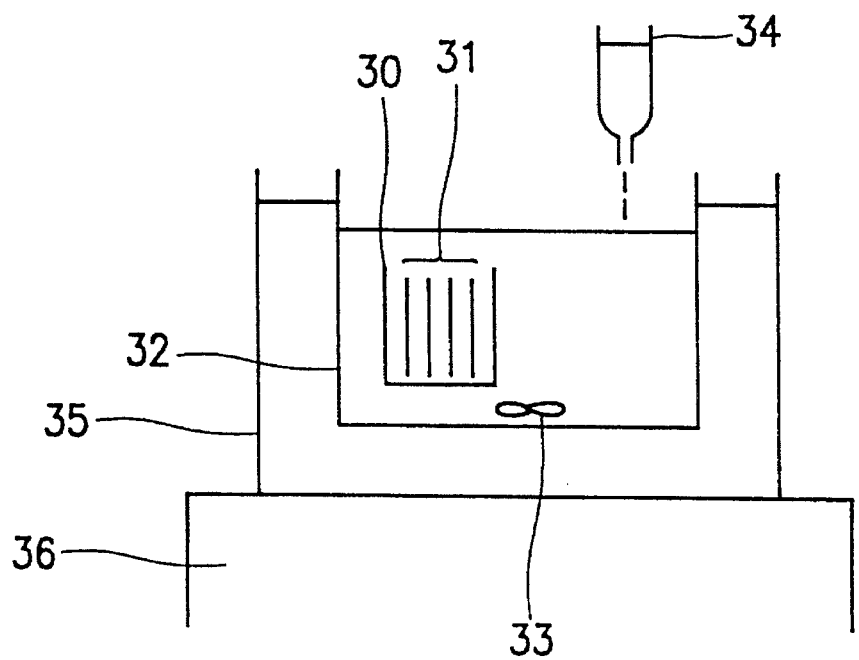
FIG. 4 shows a liquid phase deposition (LPD) device which may be used in connection with the method according to the present invention.
Figure 5:
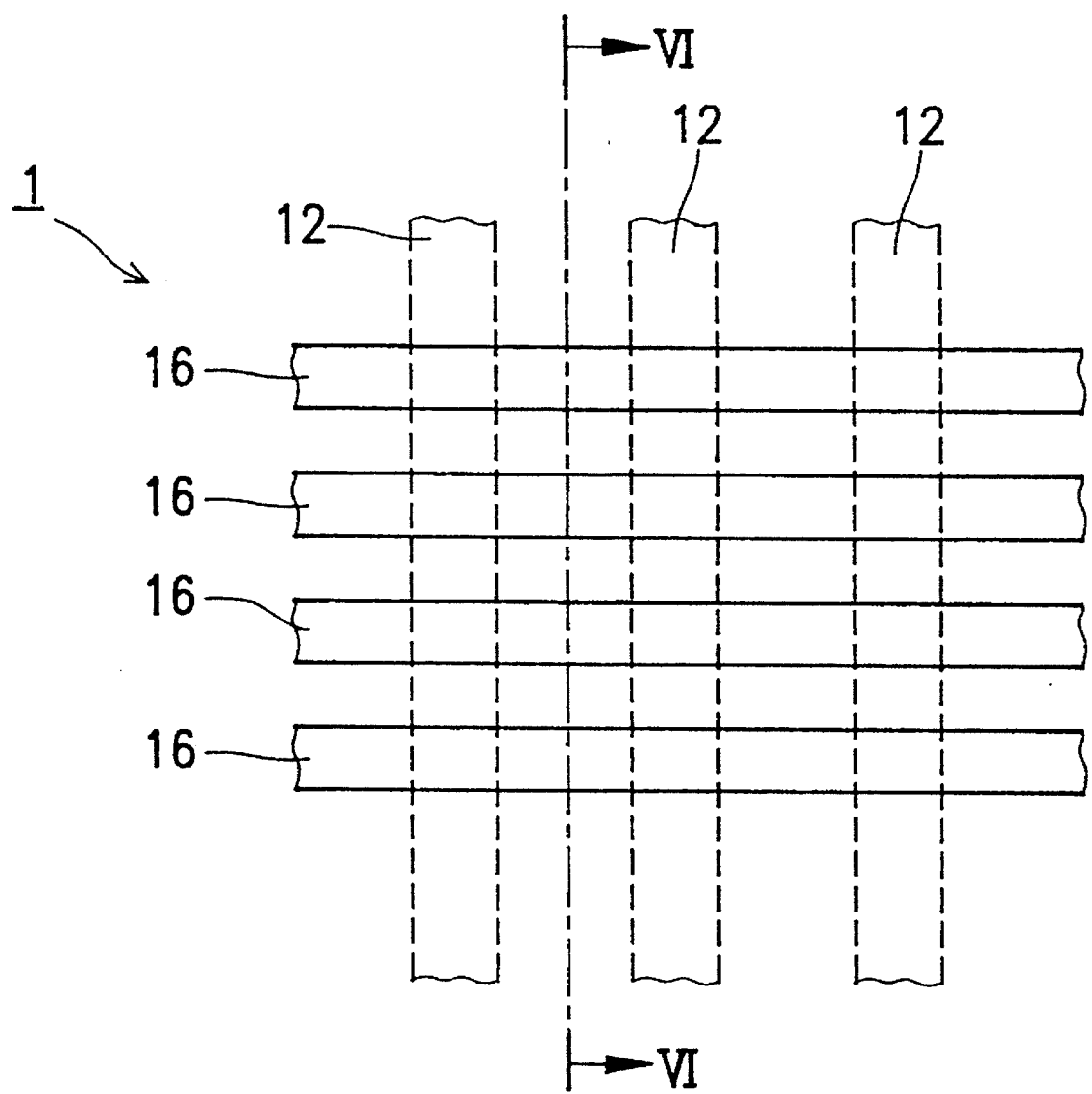
FIG. 5 is a plan view of a mask ROM according to the present invention.
Figure 6B:
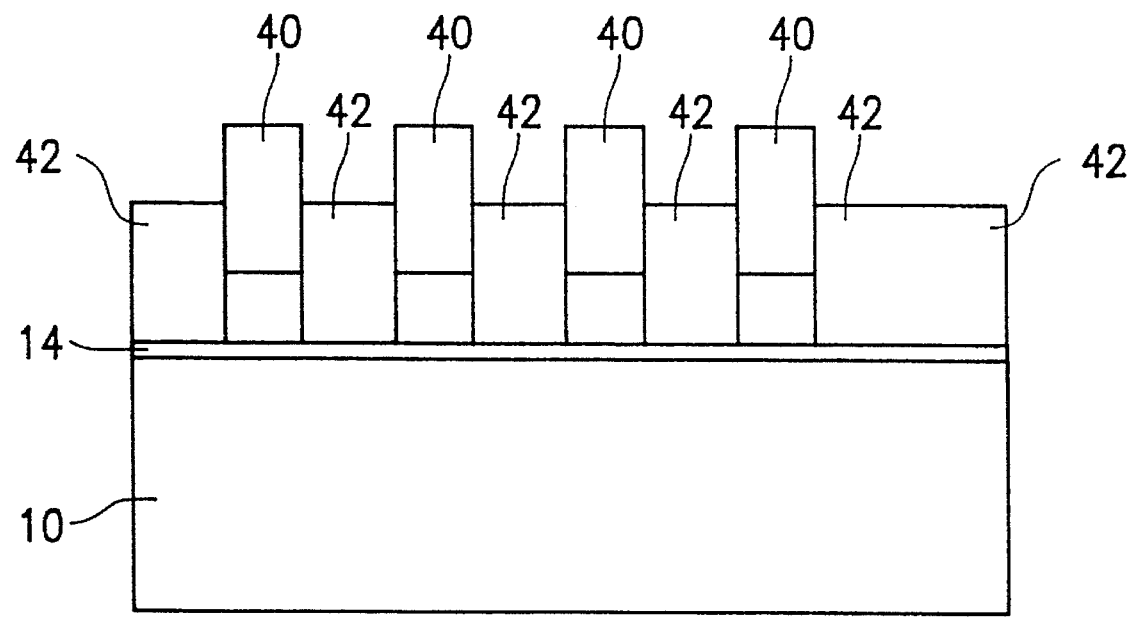

Step 2:

Referring to FIG. 6(b), the substrate 10 is next placed in a liquid phase deposition (LPD) device, as shown in FIG. 4, to form a silicon dioxide layer 42 on the gate oxide 14 between the word-lines 16. The thickness (about 1000~5000 A) of the silicon dioxide layer 42 is greater than that of the word-lines 16. The liquid phase deposition device includes a reactor 32 containing hydrofluosilicic acid ($H_2SiF_6$) as a reactant, a carrier 30 placed in the reactor 32 for holding silicon wafers 31 (which wafers include substrate 10), a stirrer 33 for stirring the reactant, a injector 34 for adding boric acid ($H_3BO_3$) into the reactor 32 to keep the hydrofluosilicic acid saturated, a water bath 35, and a temperature controlled heater 36, which maintains the temperature of the water bath 35 between 33° C. and 37° C. The reaction equations are shown as follow:

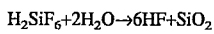

Since LPD has a relatively good deposition selectivity, silicon dioxide ($SiO_2$) will only deposit on silicon dioxide or polysilicon, not on other materials such as silicon, tungsten, or photoresist. Thus, the silicon dioxide layer 42 can be formed in a self-aligned manner.

Figure 6C:
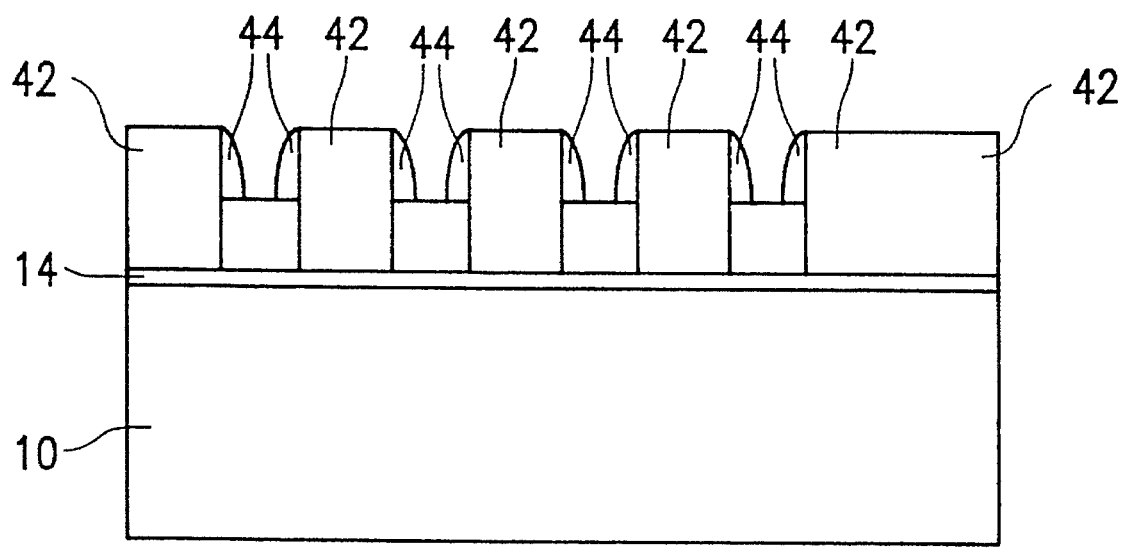

Step 3:

Referring to FIG. 6(c), the photoresist 40 is removed by using a suitable solvent. A silicon dioxide or silicon nitride layer is preferably deposited and then etched back by reactive ion etching (RIE) to form sidewall spacers 44 on the side walls of the silicon dioxide layer 42. This is an optional step which guides the succeeding impurity implantation process more precisely.

Figure 6D:
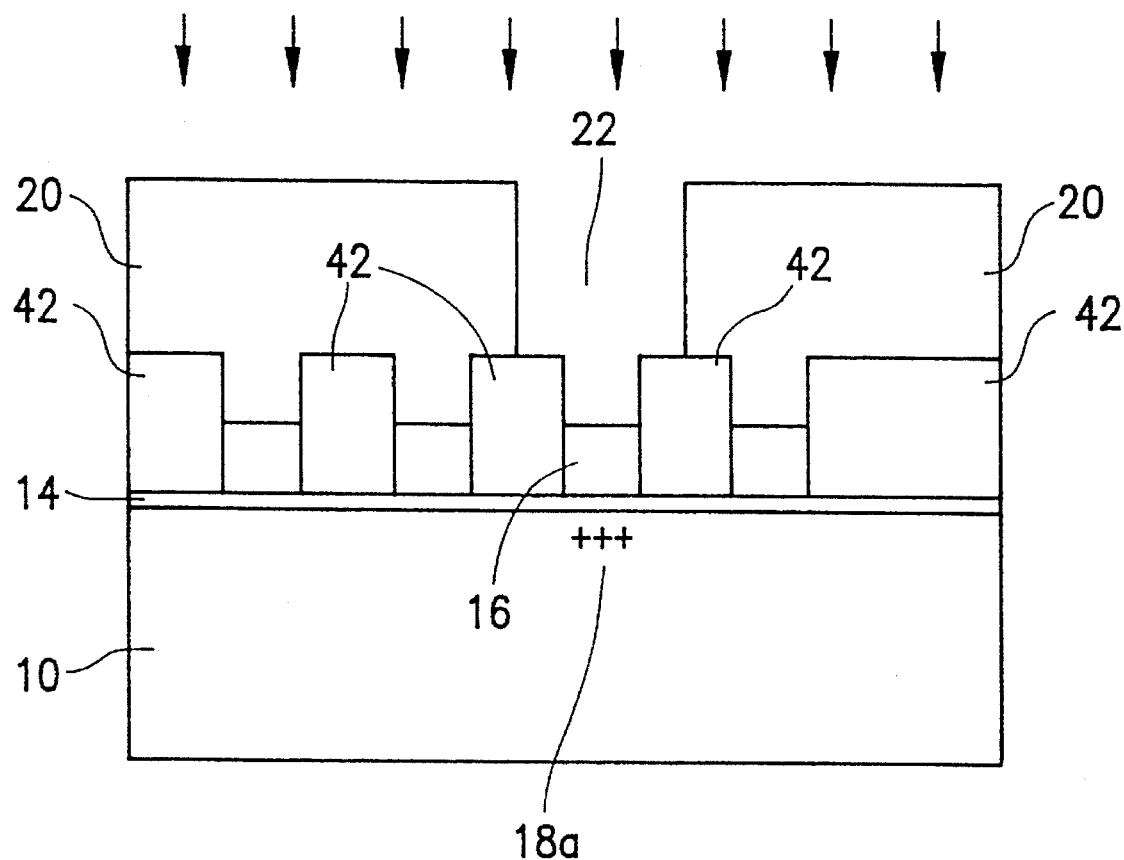

Step 4:

Referring to FIG. 6(d), impurities are implanted into the substrate 10 to make the memory cells that will be programmed operate in a first state, and leave other non-programmed memory cells operating in a second state. For example, a photoresist layer 20 is coated, exposed, and developed to form openings 22 exposing parts of the memory cells that will be programmed. Next, boron ions are implanted with an energy of about 150 KeV and a dosage of about $1\times10^{14}$ atoms/cm$^2$ through openings 22 into the substrate 10 to turn off the memory cells under openings 22 (i.e. so that those cells assume a permanent OFF state). The other memory cells under the photoresist 20 keep their initial ON state.

Figure 6E:
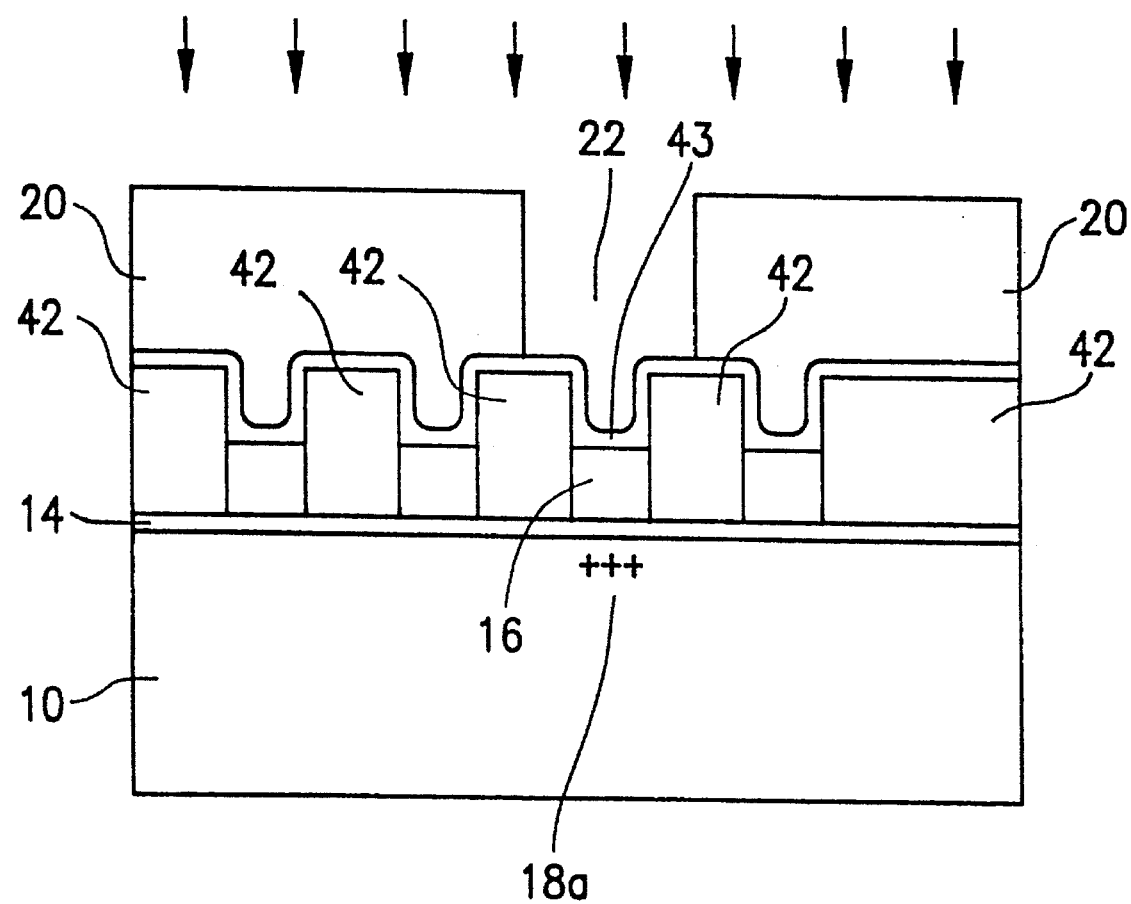

As is shown in FIG. 6(e), the ROM coding process can be performed after a passivation process. In that event, an insulating layer 43, such as a borophosphosilicate glass (BPSG) or a phosphosilicate glass (PSG), is formed on the surface of silicon dioxide layer 42 and word-lines 16 and then a photoresist layer 20 is coated, exposed, and developed to form openings 22 exposing those memory cells that are to be programmed. Boron ions are implanted with an energy of about 150 KeV and a dosage of about $1\times10^{14}$ atoms/cm$^2$ through openings 22 into the substrate 10 to turn off the memory cells under openings 22 (i.e. so that those cells assume a permanent OFF state). The other memory cells under the photoresist 20 keep their initial ON state.

In both embodiments the silicon dioxide layer 42 serves as a self-aligned mask with implantation channels being defined directly over word-lines 16. Photoresist layer 20 also serves as a mask by masking the cells which are not to be programmed. However, since the side walls of openings 22 in the photoresist 20 fall on the top surfaces of layer 42, small registration errors in forming openings 22 are accommodated without having the sort of side diffusion effects which occur in prior art devices.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A self-aligned coding process for mask ROM, comprising the steps of:

providing a substrate having a plurality of bit-lines formed therein, a gate oxide layer formed on said bit-lines, and a plurality of word-lines formed on said gate oxide layer, which together define an array of memory cells;

forming a barrier layer on said word-lines;

forming a silicon dioxide layer on said gate oxide layer between said word-lines by using liquid phase deposition, wherein the thickness of said silicon dioxide layer is larger than that of said word-lines;

removing said barrier layer so as to define trenches in said silicon dioxide layer;

forming a mask layer on said substrate exposing parts of said memory cells that will be programmed; and implanting impurities into said substrate not covered by said mask layer and said silicon dioxide layer whereby said memory cells that are programmed operate in a first state and other non-programmed memory cells operate in a second state.

2. The process as recited in claim 1, wherein said barrier layer is a photoresist layer.

3. The process as recited in claim 1, further comprising a step of forming sidewall spacers on the side walls of said trenches.

4. The process as recited in claim 3, wherein said sidewall spacers comprise silicon oxide.

5. The process as recited in claim 3, wherein said sidewall spacers comprise silicon nitride.

6. The process as recited in claim 1, wherein said first state is an OFF state, and said second state is an ON state.

7. A self-aligned coding process for mask ROM, comprising the steps of:

providing a substrate having a plurality of bit-lines formed therein, a gate oxide layer formed on said bit-lines, and a plurality of word-lines formed on said gate oxide layer, which together define an array of memory cells;

forming a barrier layer on said word-lines;

forming a silicon dioxide layer on said gate oxide layer between said word-lines by using liquid phase deposition, wherein the thickness of said silicon dioxide layer is greater than that of said word-lines;

removing said barrier layer so as to define trenches in said silicon dioxide layer;

forming an insulating layer on the surface of said silicon dioxide layer and said word-lines;

forming a mask layer on said insulating layer exposing parts of said memory cells that will be programmed; and implanting impurities through said insulating layer into said substrate not covered by said mask layer and said silicon dioxide layer whereby said memory cells that are programmed operate in a first state and other non-programmed memory cells operate in a second state.

8. The process as recited in claim 7, wherein said barrier layer is a photoresist layer.

9. The process as recited in claim 7, further comprising a step of forming sidewall spacers on side walls of said trenches.

10. The process as recited in claim 9, wherein said sidewall spacers comprise silicon oxide.

11. The process as recited in claim 9, wherein said sidewall spacers comprise silicon nitride.

12. The process as recited in claim 7, wherein said first state is an OFF state, and said second state is an ON state.

13. The process as recited in claim 7, wherein said insulating layer comprises borophosphosilicate glass.

14. The process as recited in claim 7, wherein said insulating layer comprises phosphosilicate glass.

* * * * *